(12) United States Patent
Nakano et al.

(10) Patent No.: US 8,742,668 B2
(45) Date of Patent: Jun. 3, 2014

(54) METHOD FOR STABILIZING PLASMA IGNITION

(75) Inventors: Ryu Nakano, Sagamahira (JP); Tsutomu Makino, Kodaira (JP); Hisashi Takamizawa, Tama (JP)

(73) Assignee: ASM IP Holdings B.V., Almere (NL)

( * ) Notice: Subject to any disclaimer, the term of this patent is extended or adjusted under 35 U.S.C. 154(b) by 142 days.

(21) Appl. No.: 13/604,498

(22) Filed: Sep. 5, 2012

(65) Prior Publication Data

US 2014/0062304 A1  Mar. 6, 2014

(51) Int. Cl.
*H05H 1/46* (2006.01)

(52) U.S. Cl.
USPC .................................................. 315/111.21

(58) Field of Classification Search
None
See application file for complete search history.

(56) References Cited

U.S. PATENT DOCUMENTS

| | | | | |
|---|---|---|---|---|
| 4,414,492 | A * | 11/1983 | Hanlet | 315/290 |
| 5,404,082 | A * | 4/1995 | Hernandez et al. | 315/219 |
| 5,997,768 | A | 12/1999 | Scully, Jr. | |
| 6,137,240 | A * | 10/2000 | Bogdan | 315/307 |
| 7,411,352 | B2 * | 8/2008 | Madocks | 315/111.21 |
| 7,579,785 | B2 * | 8/2009 | Shinmen et al. | 315/259 |
| 7,638,951 | B2 * | 12/2009 | DeVincentis et al. | 315/248 |
| 7,994,721 | B2 * | 8/2011 | Espiau et al. | 315/39 |
| 8,004,198 | B2 * | 8/2011 | Bakre et al. | 315/86 |
| 8,138,676 | B2 * | 3/2012 | Mills | 315/49 |
| 2005/0069651 | A1 | 3/2005 | Miyoshi | |
| 2006/0278524 | A1 * | 12/2006 | Stowell | 204/298.01 |
| 2007/0241688 | A1 * | 10/2007 | DeVincentis et al. | 315/111.21 |
| 2007/0252532 | A1 * | 11/2007 | DeVincentis et al. | 315/291 |
| 2008/0054813 | A1 * | 3/2008 | Espiau et al. | 315/111.21 |
| 2008/0133154 | A1 * | 6/2008 | Krauss | 702/58 |
| 2008/0211423 | A1 * | 9/2008 | Shinmen et al. | 315/259 |
| 2010/0134023 | A1 * | 6/2010 | Mills | 315/174 |
| 2010/0301752 | A1 * | 12/2010 | Bakre et al. | 315/86 |

FOREIGN PATENT DOCUMENTS

| | | |
|---|---|---|
| JP | 10-064696 | 3/1998 |
| JP | 2008-060304 | 3/2008 |
| JP | 2008-202107 | 9/2008 |

\* cited by examiner

*Primary Examiner* — Crystal L Hammond
(74) *Attorney, Agent, or Firm* — Snell & Wilmer L.L.P.

(57) ABSTRACT

A method for stabilizing plasma ignition in a continuous process conducted on a substrate, includes: applying a spike of RF power between an upper electrode and a lower electrode on which the substrate is placed, wherein the spike starts from zero power, jumps to a spike power, and then drops to a base power which is so low as to cause plasma ignition failure; and continuously applying RF power at the base power between the upper and lower electrode for a duration substantially longer than a duration of the spike to process the substrate. The spike is such that ignition failure is reduced.

14 Claims, 10 Drawing Sheets

METHOD FOR STABILIZING PLASMA IGNITION

BACKGROUND

1. Field of the invention

The present invention generally relates to a method of processing a substrate with plasma by, e.g., plasma-enhanced atomic layer deposition (PEALD) or other plasma-enhanced deposition, particularly to a method for stabilizing plasma ignition in such a process.

2. Description of the Related Art

In PEALD processes, for example, RF power is an important parameter for controlling film quality and characteristics. For example, high RF power can improve quality of film; however, in some applications, extremely low RF power is required. The following three applications are typical examples.

FIG. 1A is a schematic view illustrating a borosilicate glass (BSG) process for solid state diffusion (SSD). The reason that low RF power is required in this process is that if high RF power is applied, dopant implantation into a Si substrate occurs at a film-forming stage by ion bombardment. As illustrated in FIG. 1A, when a BSG film 1 is formed on a substrate 3, boron B penetrates into the substrate 3, forming a boron-diffused layer 2 in the substrate 3. It is possible to confine diffusion of such foreign matter to certain desired areas on the substrate surface by removing a BSG film while or after forming the BSG film, followed by heat treatment, so as to avoid unwanted diffusion of the foreign matter. However, if diffusion occurs during the film-forming process, foreign matter will inevitably diffuse to areas where diffusion of the foreign matter is not desired. A phosphosilicate glass (PSG) process has problems similar to the above when high RF power is applied.

FIG. 1B is a schematic view illustrating a 510 process in which oxidization of an underlying layer is not desired. The reason that low RF power is required in this present process is that if high RF power is applied, the material of the underlying layer will be oxidized at a film-forming stage by oxygen plasma, ion bombardment and/or spattering. As illustrated in FIG. 1B, when a SiO film 4 is formed on a tungsten (W) layer 6, the W layer 6 is oxidized, forming an oxidized layer 5 in the W layer 6. When an underlying layer contains materials such as W and TiN or a film such as a SiN film, and a PEALD-SiO film is deposited thereon, the material of the underlying layer is oxidized by a plasma containing an oxidizing gas for forming the PEALD-SiO film. Devices with the oxidized underlying layer do not possess desired characteristics.

FIG. 1C is a schematic view illustrating a film-forming process on a photoresist. The reason that low RF power is required in this present process is that if high RF power is applied, the photoresist will be etched or corroded at a film-forming process stage by oxygen plasma, ion bombardment and/or spattering. As illustrated in FIG. 1C, when a SiO film 7 is formed on a photoresist 8 formed on an under layer 9, the photoresist 8 is etched or corroded, diminishing the size of the photoresist 8. In a double patterning process scheme, when depositing a PEALD-oxide film on a photoresist, a plasma which includes oxidizing gas for forming the PEALD-oxide film oxidizes the underlying photoresist, and also sputtering shrinks the photoresist. As a result, a photoresist with a desirable size cannot be obtained.

On the other hand, application of low RF power causes problems. If RF power is low, the effects by power loss in RF transmitter circuits, sensitivity to matching box positioning, and/or sensitivity to changes in the atmosphere in a reaction chamber (e.g., due to changes in thickness of depositing films) become more serious. Accordingly, sometimes voltage does not reach the firing voltage, causing plasma ignition failure or shortening plasma treatment. As a result, the expected processing results (e.g., film thickness or uniformity) cannot be obtained.

Any discussion of problems and solutions involved in the related art has been included in this disclosure solely for the purposes of providing a context for the present invention, and should not be taken as an admission that any or all of the discussion were known at the time the invention was made.

SUMMARY

Some embodiments provide a method for stabilizing plasma ignition in a continuous process conducted on a substrate, comprising: (i) applying a spike of RF power between an upper electrode and a lower electrode on which the substrate is placed, wherein the spike starts from zero power, jumps to a spike power, and then drops to a base power which is so low as to cause plasma ignition failure; and (ii) continuously applying RF power at the base power between the upper and lower electrode for a duration substantially longer than a duration of the spike to process the substrate, wherein the spike is such that ignition failure is reduced.

In some embodiments, the base power is set near a firing voltage. In some embodiments, the spike ends after plasma is ignited, and the spike ends before the spike causes a substantial change to a film on the substrate as compared with a film identically processed except for using the base power without the spike.

Due to the spike of PR power application, plasma ignition failure can significantly be reduced without causing a substantial change to a film.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent front the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1A:
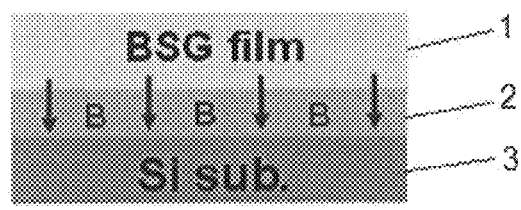
FIG. 1A is a schematic view illustrating a borosilicate glass (BSG) process for solid state diffusion (SSD)
Figure 1B:
FIG. 1B is a schematic view illustrating a SiO process in which oxidization of an underlying layer is not desired.
Figure 1C:
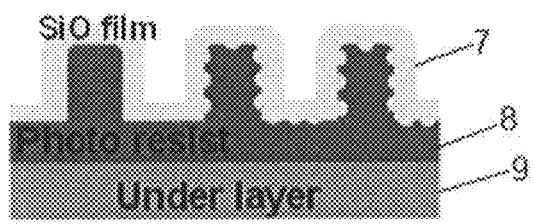
FIG. 1C is a schematic view illustrating a film-forming process on a photoresist.

In this disclosure, "gas" may include vaporized solid and/or liquid and may be constituted by a single gas or a mixture of gases. In this disclosure, the precursor, the reactant gas, and the other additive gases may be different from each other or mutually exclusive in terms of gas types, i.e., there is no overlap of gas types among these categories. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, "a" refers to a species or a genus including multiple species. Further, in this disclosure, any two numbers of a variable can constitute a workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

As described above in some embodiments, a method for stabilizing plasma ignition in a continuous process conducted on a substrate, comprises: (i) applying a spike of RF power between an upper electrode and a lower electrode on which the substrate is placed, wherein the spike starts from zero power, jumps to a spike power, and then drops to a base power which is so low as to cause plasma ignition failure; and (ii) continuously applying RF power at the base power between the upper and lower electrode for a duration substantially longer than a duration of the spike to process the substrate, wherein the spike is such that ignition failure is reduced. In this disclosure, the "continuous" process refers to a process in which RF power is continuously applied for processing a same layer, for forming a same layer, or for performing a physically or chemically same reaction, or meanings equivalent to the foregoing. Further, in this disclosure, "continuously" refers to without breaking a vacuum, without interruption as a timeline, without changing conditions except RF-related conditions, immediately thereafter, without causing a discrete physical or chemical boundary between two structures, or meanings equivalent to the foregoing. In this disclosure, the "spike" is a sharp momentary increase in RF power or a sharp rise followed by a sharp or gradual or stepped decline in RF power. The shape of the spike may typically be bar-like, but may be peaked or stepped. The duration of the spike is substantially shorter than the duration of the process in which the base power is applied. In the disclosure, "substantially shorter", "substantially longer", "substantially different", or the like may refer to a material difference or a difference recognized by a skilled artisan such as a ratio of 1/100, 10/100, 50/100, 90/100, or any ranges thereof in some embodiments.

In some embodiments, the base power is set near a firing voltage. In this disclosure, the "firing voltage" refers to the minimum potential difference between electrodes in a gas required to produce a self-sustained discharge, i.e., a discharge that can be sustained without any external excitation sources. A self-sustained discharge is maintained by excitation processes occurring in the gap between the electrodes. When the voltage is less than the firing voltage, firing cannot occur, and when the voltage is at the firing voltage, firing can occur even though ignition failure may also occur. The magnitude of the firing voltage is determined by the nature and the pressure of the gas, by the material, shape, and surface conditions of the electrodes, and by the inter-electrode gap, etc. Although one of ordinary skill in the art can readily determine whether the voltage is above the firing voltage based on whether firing occurs, it is not easy to accurately identify the exact value of the firing voltage since it is affected by the type of gas, pressure, shapes of electrodes and reactor, etc. Since it can be assumed that the voltage is above the firing voltage when firing occurs, in this disclosure, the voltage is assumed to be above the firing voltage when firing occurs, and the voltage is assumed to be "near the firing voltage" when an ignition failure ratio is more than 0%, about 20% to about 90%, or about 20% to about 50%, for example. The ignition failure ratio is defined as a ratio of the number of times when a plasma is generated without a delay when RF power is applied to the electrodes to the total number of times when RF power is applied to the electrodes. The potential between the electrodes and RF power applied therebetween are correlated to a certain degree, and when RF power applied between the electrodes increases from zero, a plasma is generated between the electrodes when RF power reaches a certain value which corresponds to the firing voltage. In some embodiments, the RF power is "a base power set near a firing voltage" when the RF power is such that the ignition failure ratio is more than 0%, about 20% to about 90% (or about 20% to about 50%). The spike power is greater than the base power, and in some embodiments, the spike power is such that the ignition failure ratio is less than about 20%, about 10% or less, or about 5% or less. The spike starts from zero power, jumps to a spike power, and then drops to a base power set near a firing voltage.

In some embodiments, the base power is so low as to cause plasma ignition failure. In some embodiments, the base power is less than about 0.12 W/cm$^2$ and the spike power is more than about 0.12 W/cm$^2$ per area of the lower electrode. In some embodiments, the base power is more than about 0.012 W/cm$^2$ or more than about 0.024 W/cm$^2$ per area of the lower electrode, if the base power is too low, a plasma will be extinguished even if a plasma is once generated. In some embodiments, the spike power is about 0.36 W/cm$^2$ or less or 0.24 W/cm$^2$ or less per area of the lower electrode. When the spike power is applied between the electrodes for a short time, the following base power can sustain a plasma with a lower ignition failure ratio even when the base power is set near a firing voltage. In some embodiments, the spike ends before the spike causes a substantial change to a film on the substrate as compared with a film identically processed except for using the base power without the spike. If the duration of the spike is too long, adverse of due to such a high power may be exerted on a substrate as discussed in the background art section. However, if the duration is short, the spike can substantially improve ignition, lowering an ignition failure ratio, without adverse effects.

In some embodiments, the spike ends after plasma is ignited in order to improve ignition. However, as described above, the duration is shortened so as to inhibit the occurrence of adverse effects. In some embodiments, the spike ends within less than about 50 msec. of the start of the spike, typically less than about 20 msec. (e.g., about 10 msec. to about 20 msec.). In some embodiments, the spike ends within a preset time period which may be regulated using a program.

Figure 2A:
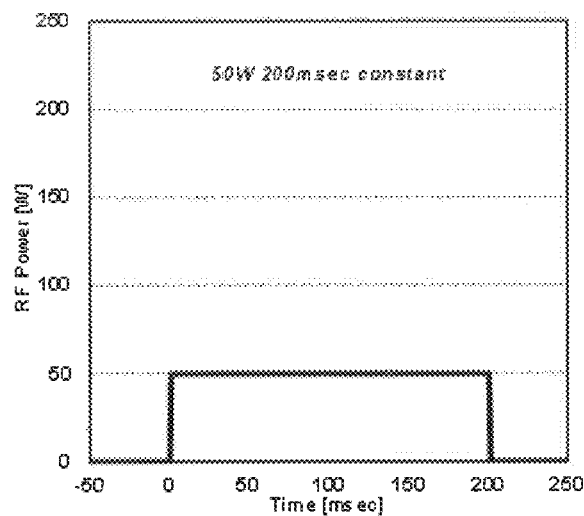
FIG. 2A illustrates a conventional pattern of RF power applied to electrodes for processing a substrate.
Figure 2B:
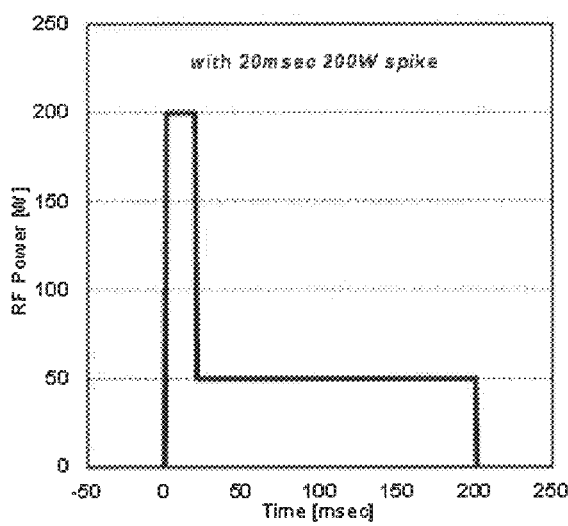
FIG. 2B illustrates a pattern of RF power applied to electrodes for processing a substrate according to an embodiment of the present invention.

FIG. 2A illustrates a conventional pattern of RF power applied to electrodes for processing a substrate, wherein RF power is constantly at 50 W from the startup at zero milliseconds to the end at 2.00 milliseconds. In the above, 50 W corresponds to power near the firing voltage, i.e., the power is so low that there is a high probability (e.g., 20% or higher) of ignition failure. FIG. 2B illustrates a pattern of RF power applied to electrodes for processing a substrate according to an embodiment of the present invention, wherein at the startup, the magnitude of RF power jumps to 200 W, and 20 milliseconds later, the magnitude of RF power drops to 50 W, constituting a spike, and thereafter, RF power is maintained at 50 W until the end at 200 milliseconds. The spike power is so high that there is a low probability (e.g., less than 20%) of ignition failure. In this embodiment, 50 W is a base power, and 200 W is a spike power, i.e., the spike power is 4 times the base power. In some embodiments, the spike power may be about 1.5 times to 10 times the base power. The duration of the spike is so short that the spike power does not cause significant or substantial damage to the substrate as compared with the case where no spike is performed.

Figure 7:
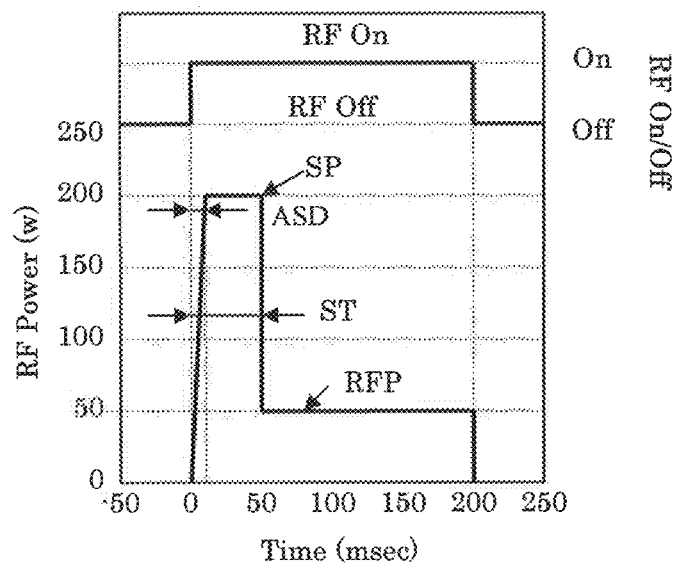
FIG. 7 is a timing chart of RF power application according to an embodiment of the present invention.

Typically, magnitude of RF power is controlled using an analog signal, and on-off switching of RF power is controlled using a digital signal. FIG. 7 is a timing chart of RF power application according to an embodiment of the present invention, wherein when RF power is turned ON ("RF On"), the digital signal is used as a trigger, and an analog signal of RF power for its magnitude is outputted. However, by its nature, an analog signal startup delay ("ASD") occurs before reaching the spike power ("SP"). Further, as explained later, the duration of the spike can be set only as a multiple of 50 milliseconds, for example, due to the traffic capacity of communication between a controller (an analog digital system) of the RF generator and a module controller (a process module controller). Thus, as illustrated in FIG. 7, the duration of the spike (or spike time "ST") is set at minimum 50 milliseconds. After the spike, RF power is maintained at the base power (or regular RF power "RFP").

Figure 9:
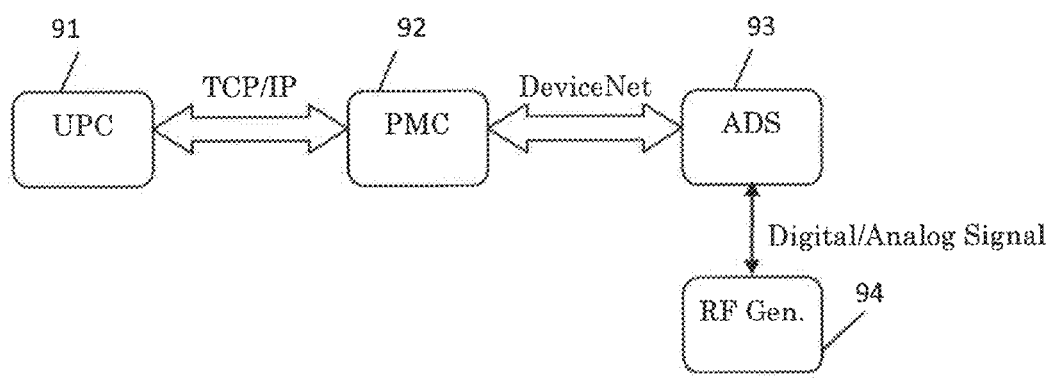
FIG. 9 illustrates a schematic control scheme for controlling an RF generator according to an embodiment of the present invention.

FIG. 9 illustrates a schematic control scheme for controlling an RF generator ("RF Gen") 94 according to an embodiment of the present invention. A main control unit ("UPC") 91, which is a controller above all, communicates with a process module controller ("PMC") 92 using transmission control protocol ("TCP") and internet protocol ("IP"), for example, which process module controller controls process modules including a process module for controlling the RF generator 94. The process module controller 92 communicates with an analog digital system ("ADS") 93 via a DeviceNet (a network system used in the automation industry to interconnect control devices for data exchange), for example. The analog digital system 93, which is disposed between the process module controller 92 and an I/O interface board of the RF generator 94, receives control commands from the process module controller 92, converts digital signals of the commands to analog signals and outputs a bit sequence to respective digital out ports. The analog digital system 93 also converts analog and digital signals from the RF generator 94 and outputs them to the process module controller 92. The process module controller 92 outputs all analog output and digital output settings to the analog digital system 93 every 50 milliseconds, and the analog digital system 93 outputs all analog input and digital input current values to the process module controller 92 every 50 milliseconds. Since the above data volume is very large, the DeviceNet cannot transmit data between the process module controller 92 and the analog digital system 93 more frequently than every 50 milliseconds. Since magnitude of RF power is controlled using an analog signal, and on-off switching of RF power is controlled using a digital signal, if the spike is controlled using a conventional control system, as illustrated in FIG. 7, the analog signal delay (ASD) at the beginning of the spike and the duration of the spike (ST) being set at a multiple of 50 milliseconds is inevitable.

Figure 8:
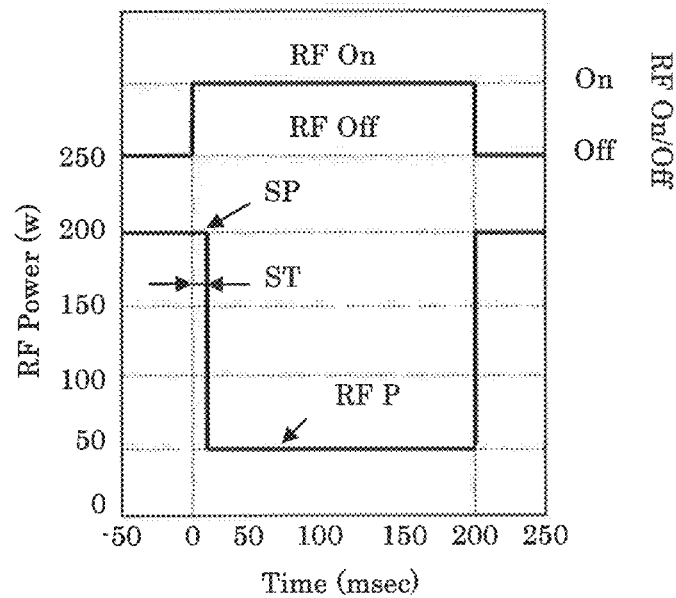
FIG. 8 is an improved timing chart of RF power application according to an embodiment of the present invention.

However, in some embodiments, by setting on-off switching signals of RF power, spike power, spike time, and base power, as parameters, at the analog digital system board, the analog digital system board can control the spike by the millisecond when using the RF power ON signal as a trigger. Further, by setting the spike power as output power when the RF power turns OFF, the analog signal delay can be avoided. FIG. 8 is a timing chart of RF power application representing the above according to an embodiment of the present invention. In this embodiment, the timing of the spike is controlled by a digital signal of on-off signaling of RF power, and spike power (SP) and spike time (ST). The spike power has a set value (magnitude of spike power) more than zero (i.e., more than base power) and is used as a parameter starting before the continuous process (−50 to 0 msec. in FIG. 8) and continuing during the spike (ST, 0 to 20 msec. in FIG. 8) in the continuous process and restarting after the continuous process (200 to 250 msec. in FIG. 8) and to be zero (i.e., base power) starting at the end of the spike in the continuous process and continuing until the end of the continuous process (20 to 200 msec. in FIG. 8). The spike power (SP) is regulated by the on-off signaling of RF power and spike time which has a set value and is used as a parameter where a timer starts counting from the beginning of the spike and continues counting until the set time is over (0 msec. to 20 msec. in FIG. 8), in FIG. 8, when RF power is OFF and the spike time timer has not started during a time period from −50 msec. to 0 msec., the spike power signal is outputted. Although the spike power signal is outputted, since RF power is OFF, no RF power is exerted. When RF power is ON and the spike time timer counts during a time period from 0 msec. to 20 msec., the spike power signal is outputted. Since during a time period of 0 msec. to 20 msec., RF power is ON and also the spike power signal is outputted, the spike power is exerted. When RF power is ON and the spike time timer is ended during a time period from 20 msec. to 200 msec., no spike power signal is outputted, i.e., a base power signal is outputted. Since RF power is ON, the base power is exerted. When RF power is OFF and the spike time timer is ended during a time period of 200 msec. to 250 msec., the spike power signal is outputted. Although the spike power signal is outputted, since RF power is OFF, no RF power is exerted. Since when RF power is ON at a time of 0 msec., the spike power signal is already outputted, the spike is generated, thereby starting the spike without an analog startup delay by eliminating changing a value of the parameter of spike power at the beginning of the spike. In this embodiment, the timing of the spike is controlled by on-off signaling of RF power, and spike power and spike time, wherein the spike time has a set value and is used as a parameter which starts counting when RF power is turned ON and continues counting until the set value is over, and the spike power has a set value and is used as a parameter which is regulated by the on-off signaling of RF power and the spike time, wherein a signal of the spike power is outputted while RF power is OFF and also while the spike time is counting, and a signal of the spike power is not outputted while RF power is ON but the spike time stops counting.

In this embodiment, as described above, when RF power is turned ON at 0 msec., the parameter of spike power already has a value set for the spike so as to eliminate raising the value from zero to the set value, thereby eliminating an analog startup delay. Further, the spike ends when the set spike time is over without waiting for a signal to end the spike outputted from the process module controller, and thus, the duration of the spike can be set by the millisecond.

Figure 10:
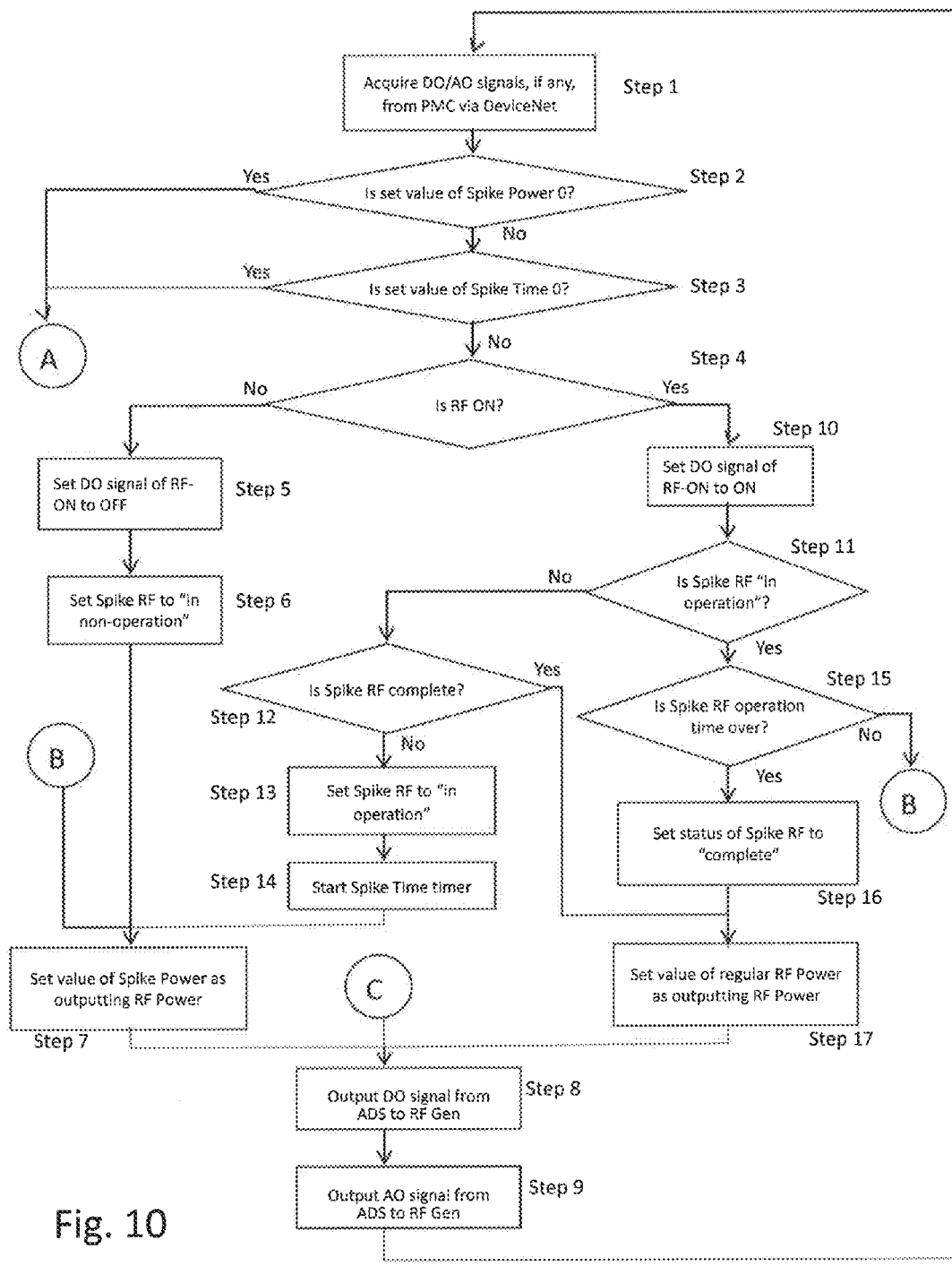
FIG. 10 is a flowchart illustrating sequences at a spike mode according to an embodiment of the present invention.

The spike control such as that illustrated in FIG. 8 can be accomplished using a program executed as shown in the flowchart illustrated in FIG. 10. In some embodiments, the parameters may be defined as shown in Table 1 below.

TABLE 1

| Parameters | Signal | Units | Remarks |
|---|---|---|---|
| Spike Power | Analog | W | An output value of spike RF power which is higher than an output value of base (or regular) RF power (since the range is equivalent to that of base power, the output value can be used as is). |
| Spike Time | Analog | msec. | An output duration of spike RF power, which can be set at one-digit milliseconds. |
| Base Power | Analog | W | An output value of base or regular RF power, which can be set according to the configuration of the RF generator. |
| RF-ON | Digital | — | On-off switching of RF power. |

First, the analog digital system (ADS) acquires digital output and analog output (DO/AO) signals, if any, from the process module controller (PMC) via the DeviceNet (step 1). The ADS and the PMC may not be able to communicate with each other every 50 msec, or less, for example, due to the limited data transmission capacity. Next, it is determined whether a set value of spike power is zero (step 2), and whether a set value of spike is zero (step 3). If neither value is zero, the spike RF mode is activated. Then, it is determined whether RF power is ON (step 4). The on-off switching of RF power is separately controlled as illustrated in FIG. 8. If RF power is not ON, for example, during a time period from −50 msec. to 0 msec. and from 200 msec. to 250 msec. in FIG. 8, a DO signal of RF-ON is set to OFF (step 5), and the status of the spike RF mode is set to "in non-operation" (step 6). Then, the value of spike RF power (spike power) is set as outputting RF power (step 7) so as to be ready for a spike when RF power is ON, wherein the RF power can jump to the spike power without a delay. Thereafter, all DO signals and all AO signals are outputted from the ADS to the RF generator (steps 8 and 9), controlling the RF generator. After step 9 wherein the RF generator is operated using the digital and analog signals, the above sequence repeats, starting with step 1.

At step 4, if it is Yes, i.e., RF power is ON, a DO signal of RF-ON is set to ON (step 10). Then, it is determined whether the spike RF mode is "in operation" (step 11). If it is NO, the spike RF mode is "in non-operation", it is determined whether the spike RF mode is complete (step 12). If it is NO, the status of the spike RF power mode is set to "in operation" (step 13), and a spike time timer starts (step 14), for example, at a time of 0 msec., in FIG. 8. The value of spike RF power (spike power) is already set as outputting RF power (step 7), followed by steps 8 and 9 so that RF power can jump to the set value of spike RF power without a delay.

At step 12, if it is YES, i.e., the spike RF mode is complete, for example, during a time period from 20 msec. to 200 msec. in FIG. 8, the value of regular RF power (base power) is set as outputting RF power (step 17), followed by steps 8 and 9.

At step 11, if it is YES, i.e., the spike RF mode is "in operation", it is determined whether the spike RF mode (spike RF operation time) is over (step 15), and if it is not yet over, for example, during a time period from 0 msec. to 20 msec. in FIG. 8, steps 7, 8, and 9 are performed so that the set value of spike RF power is exerted. At step 15, if the spike mode is over, for example, at 20 msec. in FIG. 8, the status of the spike mode is changed to "complete" (step 16). Then, the value of regular RF power (base power) is set as outputting RF power (step 17), followed by steps 8 and 9.

Figure 11:
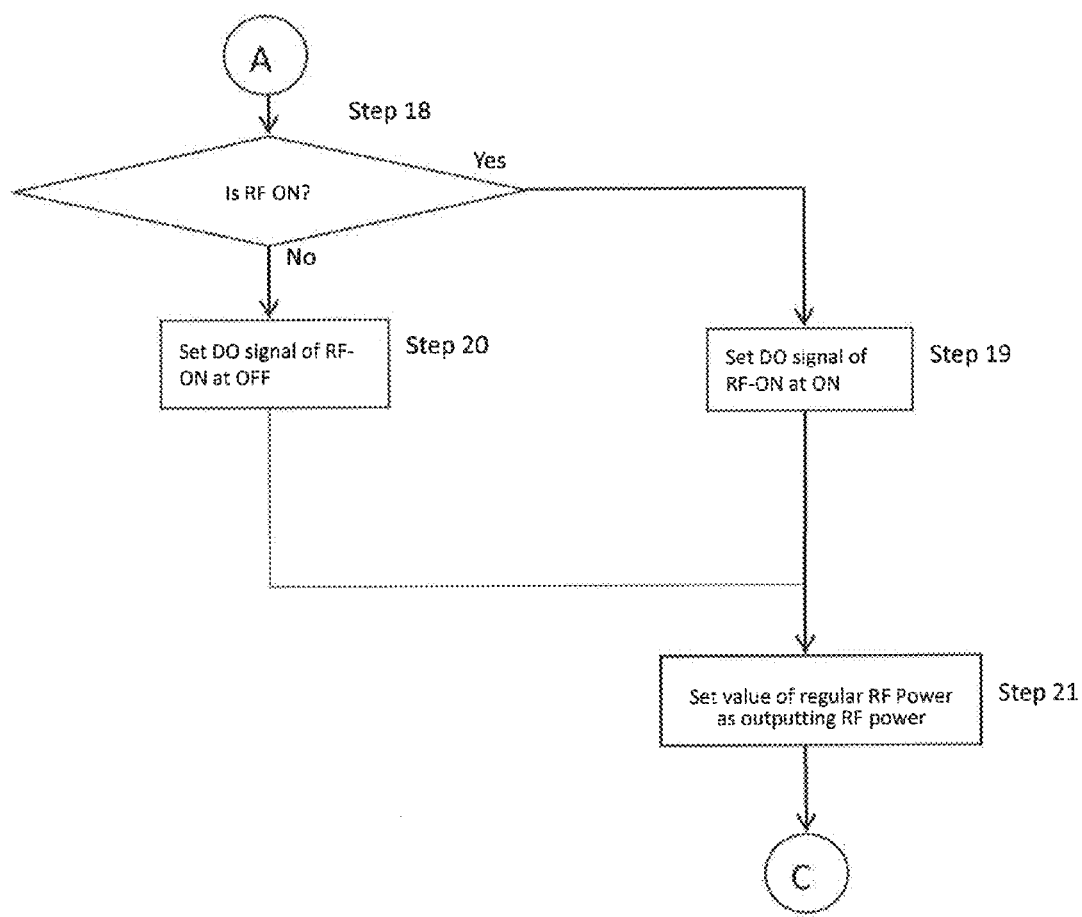
FIG. 11 is a flowchart illustrating a part of the sequences at the spike mode according to an embodiment of the present invention.

At steps 2 and 3, if either value of spike power or spike time is zero, the regular RF mode is activated as illustrated in FIG. 11. That is, it is determined whether RF power is ON (step 18). If it is YES, a DO signal of RF-ON is set to ON (step 19), and then, the value of regular RF power (base power) is set as outputting RF power (step 21), followed by steps 8 and 9, returning to step 1. At step 18, if it is NO, i.e., RF power is not ON, a DO signal of RF-ON is set to OFF (step 20), followed by steps 21, 8, and 9.

In the above embodiments, the timing of the spike is programmed and the spike is programmed to end based on elapsed time wherein the time to end the spike is set after a plasma is ignited. One of ordinary skill in the art can readily determine the timing of plasma ignition based on routine experimentation. However, in some embodiments, by monitoring plasma ignition based on signals from an RF generator and/or ignition light, the spike ends when plasma ignition is detected. In some embodiments, plasma ignition is detected by monitoring ignition light between the upper and lower electrodes using a photic sensor. In some embodiments, plasma ignition is detected by monitoring peak-to-peak voltage (Vpp) and/or self-bias voltage (Vdc) measured at a matching box of the RF generator.

Figure 4:
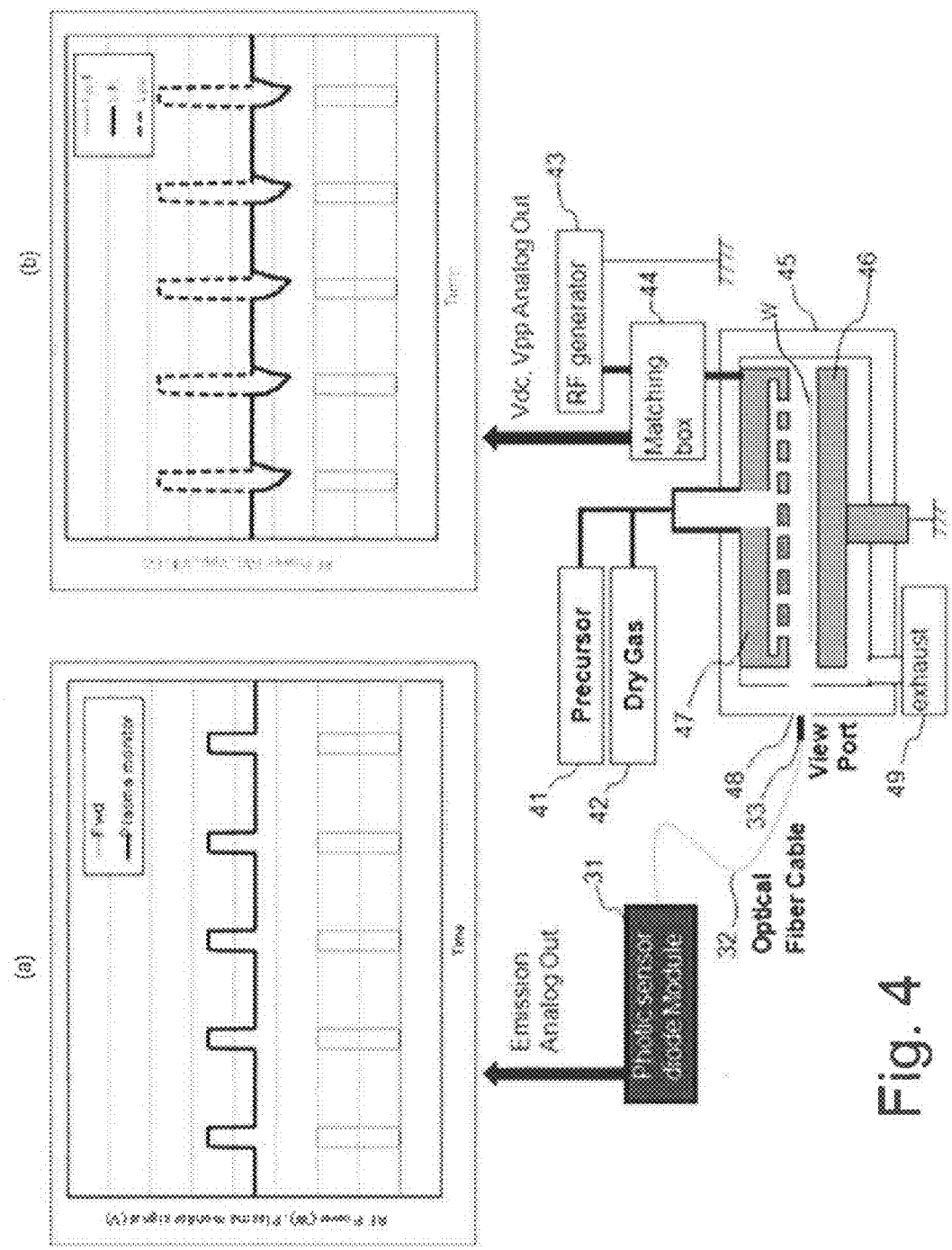
FIG. 4 is a schematic view illustrating an apparatus for plasma-enhanced atomic layer deposition (PEALD) and also illustrating variables indicative of plasma ignition according to an embodiment of the present invention.

FIG. 4 is a schematic view illustrating an apparatus for plasma-enhanced atomic layer deposition (PEALD) and also illustrating variables indicative of plasma ignition according to an embodiment of the present invention. Apparatuses usable are not limited to the apparatus illustrated in FIG. 4, some embodiments of the present invention can be applied to any suitable plasma deposition apparatus for PEALD, PECVD, cyclic PECVD, plasma etching, plasma cleaning, or other plasma treatment. The apparatus comprises a chamber 45, an upper electrode or showerhead 47, and a lower electrode or susceptor 46 installed inside the chamber 45. A substrate W is placed on the lower electrode 46, and is subjected to atomic layer deposition using a precursor supplied from a precursor source 41 and a reactant supplied from a dry gas source 42 (other gas sources are not shown) to the interior of the chamber for reaction with a plasma, which chamber is evacuated using an exhaust 49. The plasma is generated between the electrodes by applying RF power from an RF generator 43 via a matching box 44. In order to monitor ignition light from the outside, the chamber 45 has a view port 48 in which a photic sensor 33 is installed directed to a space between the upper and lower electrodes. The photic sensor 33 is connected to a photic sensor diode module 31 via an optical fiber cable 32. From the photic sensor diode module 31, an analog output signal is outputted to an ADS (not shown). A graph (a) in FIG. 4 shows a typical result of monitoring plasma light, wherein pulses of plasma monitoring (Plasma monitor) are detected which are synchronized with pulses of RF forward power (fwd).

Figure 5A:
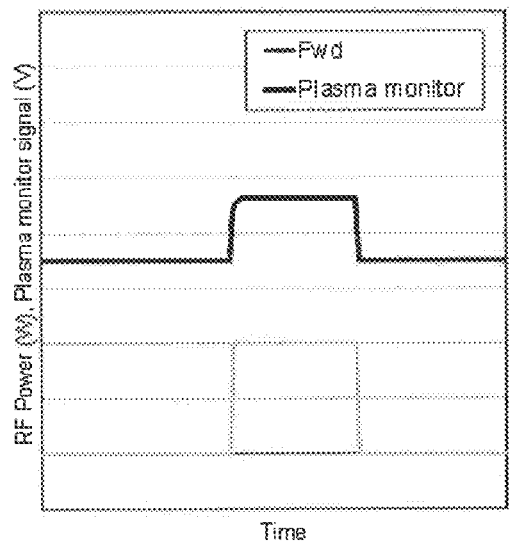
FIGS. 5A (regular ignition), 5B (ignition failure), and 5C (ignition with a spike) are graphs illustrating output of plasma monitoring (Plasma monitor) and applied RF forward power (Fwd) according to embodiments of the present invention.
Figure 5B:
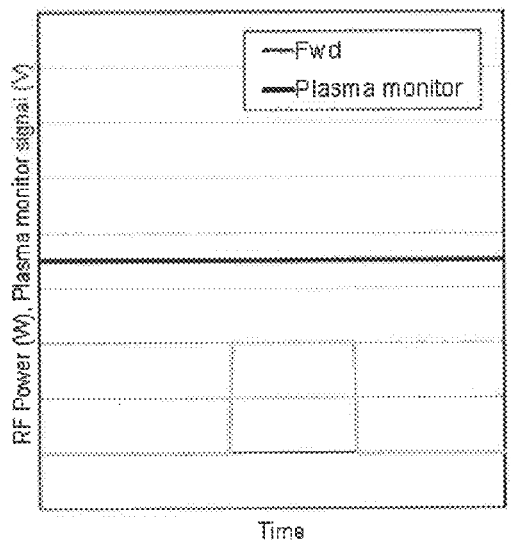
Figure 5C:
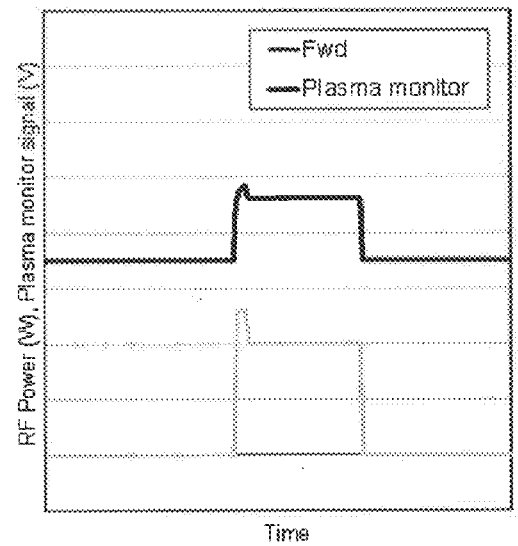

FIGS. 5A (regular ignition), 5B (ignition failure), and 5C (ignition with a spike), which show more details than in (a) in FIG. 4, are graphs illustrating output of plasma monitoring (Plasma monitor) in response to applied RF forward power (Fwd) according to embodiments of the present invention. FIG. 5A illustrates that when RF power (Fwd) is applied, a plasma is ignited, which is detected by the photic sensor (plasma sensor) outputting an analog signal (Plasma monitor), and thereafter, the signal is maintained, indicating that the plasma is maintained, until RF power is OFF. However, as shown in FIG. 5B, if the voltage of RF power is near the firing voltage, even when RF power (Fwd) is applied, sometimes, no signal is detected by the photic sensor, indicating that no plasma ignition occurs. In FIG. 5C, when RF power which is greater than the power used in FIG. 5A is applied at the beginning of RF power application, an analog signal output from the photic sensor is detected, indicating that plasma ignition occurs and immediately after the detection, RF power is reduced to the same power as in FIG. 5A, constituting a spike of RF power as shown in FIG. 5C. By applying the spike of RF power, ignition failure such as shown in FIG. 5B, can be avoided.

Returning to FIG. 4, in order to monitor plasma ignition, the chamber 45 additionally or alternatively has another detecting system for monitoring peak-to-peak voltage (Vpp) and/or self-bias voltage (Vdc) measured at the matching box 44 of the RF generator. A graph (b) in FIG. 4 shows a typical result of monitoring plasma ignition, wherein pulses of Vdc and Vpp are detected which are synchronized with pulses of RF forward power (fwd).

Figure 6A:
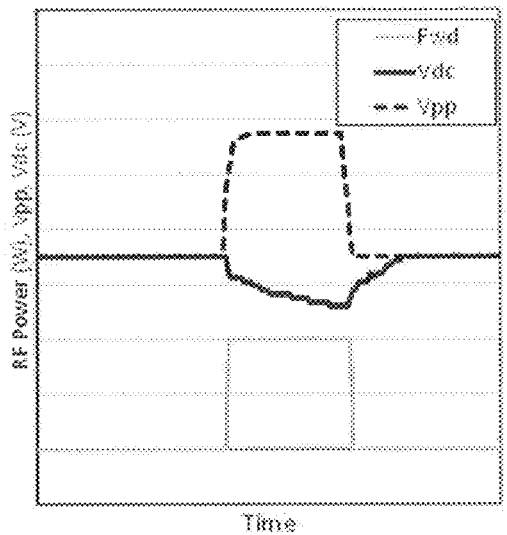
FIGS. 6A (regular ignition), 6B (ignition failure), and 6C (ignition with a spike) are graphs illustrating output of Vdc and Vpp in response to applied RF forward power (Fwd) according to embodiments of the present invention.
Figure 6B:
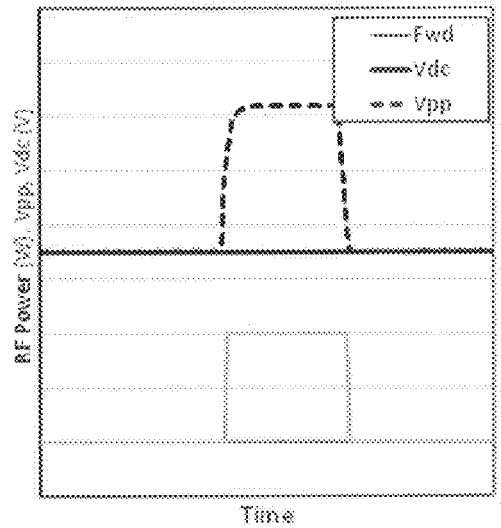
Figure 6C:
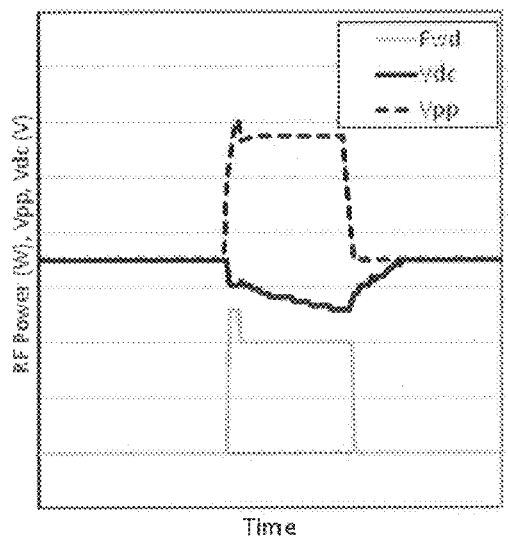

FIGS. 6A (regular ignition), 6B (ignition failure), and 6C (ignition with a spike), which show more details than in (b) in FIG. 4, are graphs illustrating output of Vdc and Vpp in response to applied RF forward power (Fwd) according to embodiments of the present invention. FIG. 6A illustrates that when RF power (Fwd) is applied, a plasma is ignited, which changes Vdc, creating a downward pulse of Vdc, while a pulse of Vpp is highly correlated to a pulse of RF power, regardless of plasma ignition. However, as shown in FIG. 6B, if the voltage of RF power is near the firing voltage, even when RF power (Fwd) is applied, sometimes, no change of Vdc is detected, indicating that no plasma ignition occurs. In FIG. 6C, when RF power which is greater than the power used in FIG. 6A is applied at the beginning of RF power application, a change of Vdc is detected, indicating that plasma ignition occurs, and immediately after the detection, RF power is reduced to the same power as in FIG. 6A, constituting a spike of RF power as shown in FIG. 6C. A spike of Vpp reflects the spike of RF power. By applying the spike of RF power, ignition failure such as shown in FIG. 6B, can be avoided.

In the above embodiments and other embodiments, a skilled artisan will appreciate that the apparatus includes one or more controller(s) (not shown) programmed or otherwise configured to cause the above detection processes described elsewhere herein to be conducted. The controller(s) are communicated with the power sources, heating systems, pumps, robotics and gas flow controllers or valves of the reactor, as will be appreciated by the skilled artisan.

The disclosed embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLES

A semiconductor substrate (300 mm in diameter) was loaded onto a susceptor having a diameter of 325 mm of an apparatus illustrated in FIG. 4 for PEALD of borosilicate glass (BSG), and a film of BSG was deposited on the substrate under the conditions as follows:

PEALD for BSG:

Precursor: BDEAS, TEOB

Precursor inflow pressure: 400 Pa

Substrate temperature: 300° C.

Carrier gas flow: 2.0 SLM (continuous)

Reactant gas flow: 0.5 SLM (continuous)

Precursor supply time per cycle: 0.3 seconds

Purge time after precursor pulse: 1.0 seconds

RF frequency: 13.56 MHz

RF Plasma exciting time per cycle: 0.2 seconds

Purge time after RF application cycle: 0.1 seconds

Each cycle of RF power application was controlled based on FIG. 2B using a program executing the sequences illustrated in FIGS. 10 and 11 under the conditions shown in Table 2 below. Under the respective conditions, a plasma ignition failure ratio (a ratio of the number of times when a plasma was generated without a delay when RF power was applied to the electrodes to the total number of times when RF power was applied to the electrodes) was determined, and the results are also shown in Table 2.

TABLE 2

| No | Base power | Spike power | Spike duration | Plasma ignition failure ratio |
|---|---|---|---|---|
| 1 | 50 W | None | None | 35% |
| 2 | 50 W | 100 W | 10 msec | 35% |
| 3 | 50 W | 200 W | 10 msec | 35% |
| 4 | 50 W | 300 W | 10 msec | 15% |
| 5 | 50 W | 400 W | 10 msec | 0% |
| 6 | 50 W | 500 W | 10 msec | 0% |
| 7 | 50 W | 100 W | 20 msec | 35% |
| 8 | 50 W | 200 W | 20 msec | 5% |
| 9 | 50 W | 100 W | 50 msec | 30% |
| 10 | 50 W | 200 W | 50 msec | 0% |

As shown in Table 2, when no spike was applied in Example 1, the ignition failure ratio was 35%, which was considered to indicate that 50 W was an RF power near the firing voltage (when the ignition failure ratio is more than 20%, for example, the RF power is considered to be set near the firing voltage under the conditions). When a spike having a spike power of 100 W and a spike duration of 10 milliseconds was applied in Example 2, the ignition failure ratio was still 35% and was not improved. Further, when a spike having a spike power of 100 W and a spike duration of 20 milliseconds, twice the time in Example 2, was applied in Example 7, the ignition failure ratio was still 35% and was not improved. Furthermore, when a spike having a spike power of 100 W and a spike duration of 50 milliseconds, five times that in Example 2, was applied in Example 9, the ignition failure ratio was still as high as 30% and was not significantly improved. Thus, when the spike power is not high, even when the duration is prolonged, ignition failure is not substantially improved.

When a spike having a spike power of 200 W, twice the power in Example 2, and a spike duration of 10 milliseconds was applied in Example 3, the ignition failure ratio was still 35% and was not improved. However, when a spike having a spike power of 200 W, and a spike duration of 20 milliseconds, twice that in Example 3, was applied in Example 8, the ignition failure ratio was substantially reduced to 5% and was substantially improved. When a spike having a spike power of 200 W, and a spike duration of 50 milliseconds, five times that in Example 3, was applied in Example 10, the ignition failure ratio was drastically reduced to 0% and was drastically improved. When a spike having a spike power of 300 W, three times the power in Example 2, and a spike duration of 10 milliseconds was applied in Example 4, the ignition failure ratio was significantly reduced to 15% and was significantly improved. Further, when a spike having a spike power of 400 W, four times the power in Example 2, and a spike duration of 10 milliseconds was applied in Example 5, the ignition failure ratio was drastically reduced to 0% and was drastically improved. Furthermore, when a spike having a spike power of 500 W, five times the power in Example 2, and a spike duration of 10 milliseconds was applied in Example 6, the ignition failure ratio was drastically reduced to 0% and was drastically improved. Thus, by using the spike having an RF power of at least 200 W for an appropriate time period (e.g., about 20 milliseconds at about 200 W; about 10 milliseconds at about 300 W), ignition failure can substantially be improved.

Figure 3:
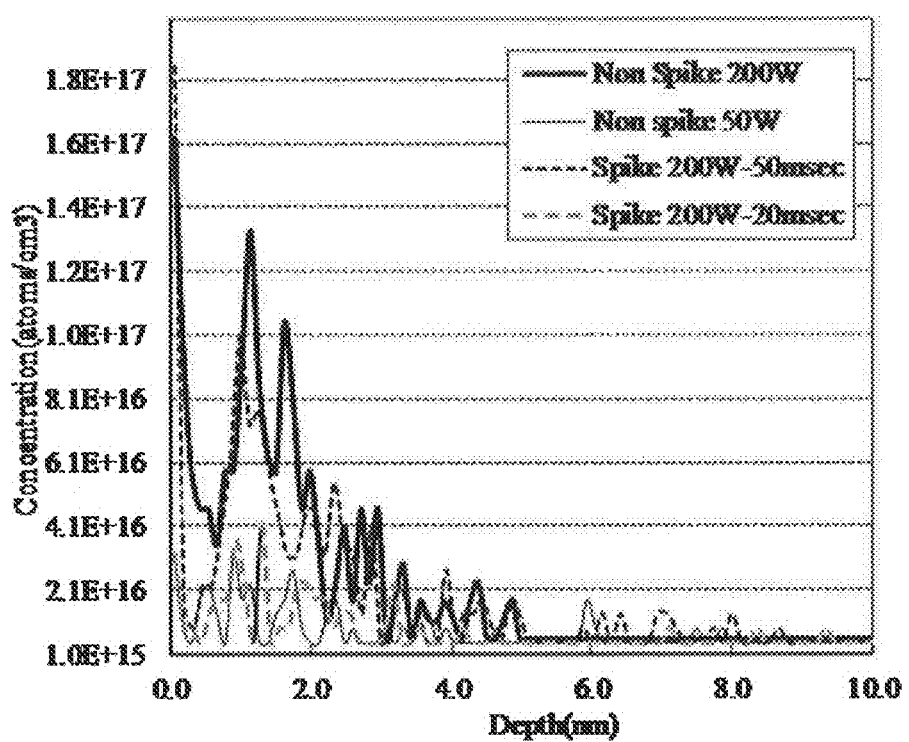
FIG. 3 is a graph showing results of second ion mass spectrometry (SIMS) indicating concentrations of boron penetrated into substrates when borosilicate glass (BSG) was deposited on each substrate by PEALD.

Next, under the same conditions as above except the following, borosilicate glass (BSG) was deposited on four substrates: 50 W without a spike, 50 W with a spike of 200 W for 20 milliseconds, 50 W with a spike of 200 W for 50 milliseconds, and 200 W without a spike. The thus-obtained substrates were submerged in DHF to remove the BSG films and expose surfaces of the substrates, which surfaces were subjected to second ion mass spectrometry (SIMS) to measure a concentration of boron penetrated into the substrates. The results are shown in FIG. 3. When an RF power of 50 W without a spike was applied to deposit a BSG film on the substrate, ignition was unstable as shown in Table 2 above (Example 1), the concentration of boron penetrated and diffused in the substrate was within the order of 4E+16 atom/$cm^3$ as shown in FIG. 3, indicating that the bombardment of dopant boron was not serious. On the other hand, when an RF power of 200 W without a spike was applied to deposit a BSG film on the substrate, ignition was stable (zero percent ignition failure), but the concentration of boron penetrated and diffused in the substrate was increased to the order of 1.5E+17 atom/$cm^3$ as shown in FIG. 3, indicating that the bombardment of dopant boron was significant. When an RF power of 50 W with a spike of 200 W for 50 msec. was applied to deposit a BSG film on the substrate, ignition was stable as shown in Table 2 (Example 10, zero percent ignition failure), but the concentration of boron penetrated and diffused in the substrate was increased to substantially the same level as in the case of applying an RF power of 200 W without a spike as shown in FIG. 3, indicating that if the duration of the spike was too long (about 50 msec, or longer), the bombardment of dopant boron was as significant as the continuous application of the spike power. When an RF power of 50 W with a spike of 200 W for 20 msec. was applied to deposit a BSG film on the substrate, ignition was stable as shown in Table 2 (Example 8, 5% ignition failure), and the concentration of boron penetrated and diffused in the substrate was not increased and was substantially the same level as in the case of applying an RF power of 50 W without a spike as shown in FIG. 3, indicating that if the duration of the spike was short enough (about 20 msec, or shorter), the bombardment of dopant boron was as controlled as the continuous application of the base power without a spike, and the spike did not cause substantial changes to the substrate.

As shown in the above, when the spike power (P [W]) and the spike time (T [msec.]) are appropriately set, plasma ignition can effectively be stabilized without causing substantial changes to a substrate by the spike. Although the appropriate P and T depend on the material of the substrate, the type of the process, etc., one of ordinary skill in the art can determine the appropriate P and T based on this disclosure and additional routine experimentation. In some embodiments, the equation P=(2000/T)+100 is applied for a susceptor having a diameter of 325 mm, and P±20% and T±20% can be employed. In some embodiments, the power of the spike per area of the lower electrode, P, is set at 0.15 W/$cm^2$ to 0.6 W/$cm^2$, and the duration of the spike [msec.] is T±50% or T±20%, wherein T=2.4/(P−0.12).

In some embodiments, the present invention is applied to any suitable plasma processing including the processes discussed in the background art section.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for stabilizing plasma ignition in a continuous process conducted on a substrate, comprising:
    applying a spike of RF power between an upper electrode and a lower electrode on which the substrate is placed, wherein the spike starts from zero power, jumps to a spike power, and then drops to a base power which is so low as to cause plasma ignition failure; and continuously applying RF power at the base power between the upper and lower electrode for a duration substantially longer than a duration of the spike to process the substrate, wherein the spike is such that ignition failure is reduced.

2. The method according to claim 1, wherein the base power is set near a firing voltage.

3. The method according to claim 2, wherein the base power is less than about 0.12 W/cm$^2$ and the spike power is more than about 0.12 W/cm$^2$ per area of the lower electrode.

4. The method according to claim 3, wherein the spike power is about 0.36 W/cm$^2$ or less per area of the lower electrode.

5. The method according to claim 1, wherein the spike ends after plasma is ignited.

6. The method according to claim 5, wherein the spike ends before the spike causes a substantial change to a film on the substrate as compared with a film identically processed except for using the base power without the spike.

7. The method according to claim 5, wherein the spike ends within about 20 msec. of the start of the spike.

8. The method according to claim 5, further comprising monitoring plasma ignition based on signals from an RF generator and/or ignition light, and ending the spike when plasma ignition is detected.

9. The method according to claim 8, wherein plasma ignition is detected by monitoring ignition light between the upper and lower electrodes using a photic sensor.

10. The method according to claim 8, wherein plasma ignition is detected by monitoring peak-to-peak voltage (Vpp) and/or self-bias voltage (Vdc) measured at a matching box of the RF generator.

11. The method according to claim 5, wherein the spike ends within a preset time period.

12. The method according to claim 11, wherein the timing of the spike is controlled by on-off signaling of RF power, and spike power and spike time, said spike time having a set value and being used as a parameter which starts counting when RF power is turned ON and continues counting until the set value is over, said spike power having a set value and being used as a parameter which is regulated by the on-off signaling of RF power and the spike time, wherein a signal of the spike power is outputted while RF power is OFF and also while the spike time is counting, and a signal of the spike power is not outputted while RF power is ON but the spike time stops counting, wherein when RF power is turned ON, the spike is generated, thereby starting the spike without an analog startup delay by eliminating changing a value of the parameter of spike power at the beginning of the spike.

13. The method according to claim 12, wherein the duration of spike time is set at about 20 msec.

14. The method according to claim 1, wherein the continuous process is a process of plasma-enhanced atomic layer deposition (PEALD).

* * * * *